US009847284B2

(12) United States Patent
Zhai

(10) Patent No.: US 9,847,284 B2
(45) Date of Patent: Dec. 19, 2017

(54) STACKED WAFER DDR PACKAGE

(71) Applicant: Apple Inc., Cupertino, CA (US)

(72) Inventor: Jun Zhai, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 13/753,027

(22) Filed: Jan. 29, 2013

(65) Prior Publication Data

US 2014/0210107 A1   Jul. 31, 2014

(51) Int. Cl.
*H01L 25/065* (2006.01)
*H01L 23/498* (2006.01)
(Continued)

(52) U.S. Cl.
CPC ...... *H01L 23/498* (2013.01); *H01L 23/49816* (2013.01); *H01L 23/49827* (2013.01); *H01L 25/03* (2013.01); *H01L 23/3128* (2013.01); *H01L 23/49861* (2013.01); *H01L 23/5386* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2224/131* (2013.01); *H01L 2224/136* (2013.01); *H01L 2224/13124* (2013.01); *H01L 2224/13147* (2013.01); *H01L 2224/16145* (2013.01); *H01L 2224/16225* (2013.01); *H01L 2224/16227* (2013.01); *H01L 2224/16235* (2013.01); *H01L 2224/2919* (2013.01); *H01L 2224/73104* (2013.01); *H01L 2224/73204* (2013.01); *H01L 2224/8121* (2013.01); *H01L 2224/81191* (2013.01);
(Continued)

(58) Field of Classification Search
CPC ............ H01L 25/0657; H01L 2224/97; H01L 25/777; H01L 2225/06527; H01L 2225/06517; H01L 2225/06548; H01L 2225/1041; H01L 2225/06572; H01L 23/5386; H01L 23/49861
USPC ......................................................... 257/777
See application file for complete search history.

(56) References Cited

U.S. PATENT DOCUMENTS 5,477,160 A * 12/1995 Love ................... G01R 1/07314
324/756.02
5,977,640 A * 11/1999 Bertin ................. H01L 25/0657
257/686
(Continued)

OTHER PUBLICATIONS

International Search Report and Written Opinion from PCT/US2014/012072, dated Jun. 18, 2014, Apple Inc.
(Continued)

*Primary Examiner* — David Zarneke
(74) *Attorney, Agent, or Firm* — Meyertons, Hood, Kivlin, Kowert & Goetzel, P.C.; Gareth M. Sampson; Lawrence J. Merkel

(57) ABSTRACT

A top package used in a PoP (package-on-package) package includes two memory die stacked with a redistribution layer (RDL) between the die. The first memory die is encapsulated in an encapsulant and coupled to a top surface of the RDL. A second memory die is coupled to a bottom surface of the RDL. The second memory die is coupled to the RDL with either a capillary underfill material or a non-conductive paste. The RDL includes routing between each of the memory die and one or more terminals coupled to the RDL on a periphery of the die.

20 Claims, 2 Drawing Sheets

(51) Int. Cl.
  *H01L 23/538* (2006.01)
  *H01L 25/03* (2006.01)
  *H01L 23/31* (2006.01)
  *H01L 23/00* (2006.01)

(52) U.S. Cl.
  CPC ............... *H01L 2224/81203* (2013.01); *H01L 2224/81815* (2013.01); *H01L 2224/83102* (2013.01); *H01L 2224/83191* (2013.01); *H01L 2224/83192* (2013.01); *H01L 2225/06517* (2013.01); *H01L 2225/06527* (2013.01); *H01L 2225/06572* (2013.01); *H01L 2924/15311* (2013.01); *H01L 2924/15321* (2013.01)

(56) References Cited

U.S. PATENT DOCUMENTS

| | | | |
|---|---|---|---|
| 6,137,164 A * | 10/2000 | Yew | H01L 23/49816 257/686 |
| 6,365,962 B1 * | 4/2002 | Liang | H01L 23/5387 257/668 |
| 6,424,034 B1 * | 7/2002 | Ahn | H01L 25/18 257/685 |
| 6,743,664 B2 * | 6/2004 | Liang | H01L 23/5387 257/E23.177 |
| 7,005,316 B2 | 2/2006 | Lee et al. | |
| 7,262,507 B2 * | 8/2007 | Hino | H01L 25/0657 257/177 |
| 7,619,303 B2 * | 11/2009 | Bayan | H01L 23/49541 257/666 |
| 8,247,268 B2 | 8/2012 | Do et al. | |
| 8,399,983 B1 * | 3/2013 | New | H01L 23/04 257/686 |
| 8,456,020 B2 * | 6/2013 | Kurita | H01L 21/561 257/737 |
| 2007/0018333 A1 * | 1/2007 | Tsai et al. | 257/777 |
| 2008/0197469 A1 | 8/2008 | Yang et al. | |
| 2009/0160039 A1 * | 6/2009 | Wong | H01L 23/3107 257/673 |
| 2010/0001389 A1 * | 1/2010 | Chen | H01L 21/561 257/685 |
| 2011/0037169 A1 | 2/2011 | Pagaila | |
| 2011/0089561 A1 | 4/2011 | Kurita et al. | |
| 2011/0101512 A1 | 5/2011 | Choi et al. | |
| 2011/0272814 A1 | 11/2011 | Wachtler et al. | |
| 2012/0228760 A1 | 9/2012 | Lim et al. | |

OTHER PUBLICATIONS

Invitation to Pay Additional Fees from Application Serial No. PCT/US2014/012072, dated Apr. 30, 2014, Apple Inc., pp. 1-7.
International Preliminary Report on Patentability in application No. PCT/US2014/012072 dated Aug. 13, 2015, 12 pages.
Final Office Action, Taiwan Application No. 103102793, dated Jun. 11, 2015, 6 pages.

* cited by examiner

STACKED WAFER DDR PACKAGE

BACKGROUND

1. Field of the Invention

The present invention relates to semiconductor packaging and methods for packaging semiconductor devices. More particularly, the invention relates to a top package of a PoP (package-on-package) for memory die.

2. Description of Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "pre-stacking" or the integration of system on a chip ("SoC") technology with memory technology) allows for thinner packages. Such pre-stacking has become a critical component for thin and fine pitch PoP packages.

One limitation in reducing the size of a package (e.g., either the top package (the memory package) or the bottom package (the SoC package) in the PoP package) is the size of the substrate used in the package. Thin substrates and/or coreless substrates (e.g., laminate substrates) have been used to reduce the size of the packages to certain levels. Further reductions in size, however, may be needed in order to provide even smaller packages for next generation devices.

One or more memory die are typically placed in the top package of a PoP package. Using a single memory die (e.g., a single 8 GB (gigabyte) DDR (double date rate) memory die) in the top package is achieved relatively easy (e.g., connections to terminals on the package are reliable and simple to make and the top package has a relatively thin profile). The single memory die, however, may not provide sufficient capability for newer and more powerful devices. Thus, devices requiring larger memory capability typically need two or more die in the top package (e.g., two or more 8 GB DDR memory die).

A typical configuration for putting two memory die in a top package is to vertically stack the memory die (e.g., stack one memory die directly on top of another memory die). Vertically stacking the memory die reduces the overall thickness of the top package. Stacking the die vertically, however, creates problems with connecting both die to terminals on the package. Typically, the die are connected to the terminals using wire bonding between the top of the memory die (with at least part of the bottom memory die in the stack protruding beyond the edge of the top memory die) and terminals on the substrate of the top package. Using wire bonding, however, increases the height of the top package as the wire bond paths are spaced to prevent shorting of the different wire bonds from each memory die. In addition, wire bonding may provide a high impedance path that reduces signal integrity and/or power integrity between the memory die and the terminals. A possible solution to overcome the problems with wire bonding is to provide through silicon vias (TSVs) from the memory die to the terminals in the top package. Providing TSVs, however, requires special memory die, adds several additional process steps, and is relatively expensive.

SUMMARY

In certain embodiments, a top package of a PoP package includes two memory die. A first memory die may be at least partially encapsulated in an encapsulant. A bottom surface of the first memory die may be coupled to a redistribution layer (RDL). A second memory die may be coupled to the bottom surface of the RDL. In some embodiments, the second memory die is coupled to the RDL using reflow of a capillary underfill material. In some embodiments, the second memory die is coupled to the RDL using thermal compression bonding with a non-conductive paste.

The RDL may include routing between the first memory die and one or more first terminals coupled to the RDL on a periphery of the die. The RDL may also include electrically separate routing between the second memory die and one or more second terminals coupled to the RDL on a periphery of the die. The routing between the first memory die and the first terminals may be electrically isolated from the routing between the second memory die and the second terminals. The RDL reduces the overall thickness of the top package and improves signal and power integrity in the top package.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
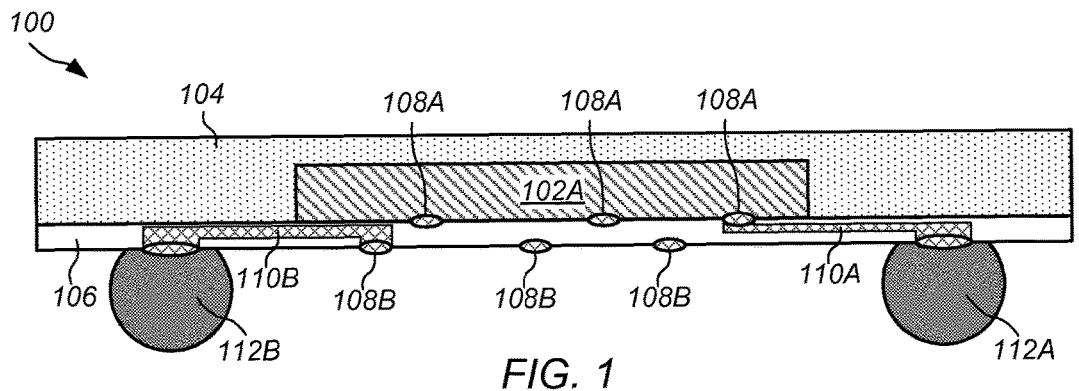
FIG. 1 depicts a cross-sectional representation of an encapsulated memory die with a redistribution layer coupled to the memory die.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

Figure 2:
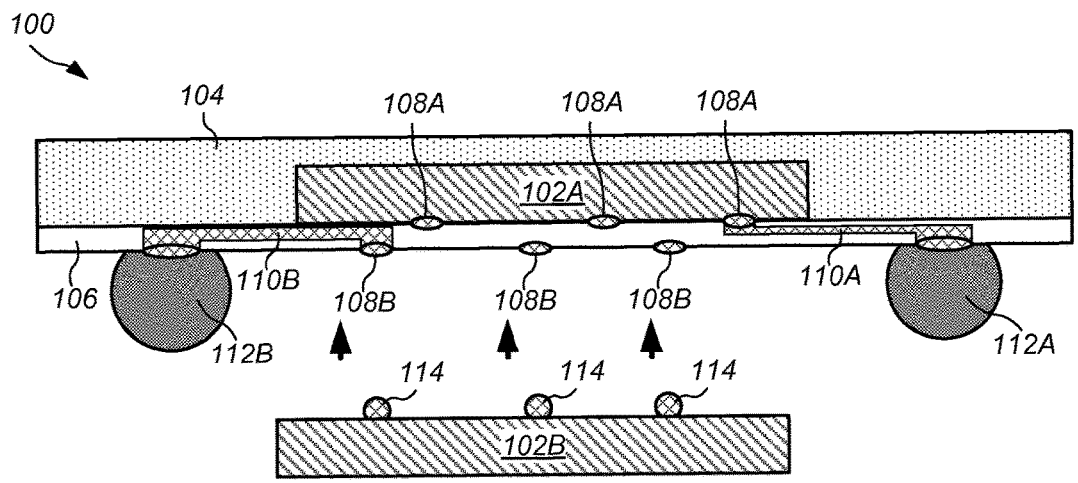
FIG. 2 depicts a cross-sectional representation of an embodiment of the encapsulated memory die of FIG. 1 being coupled to a second memory die.
Figure 3:
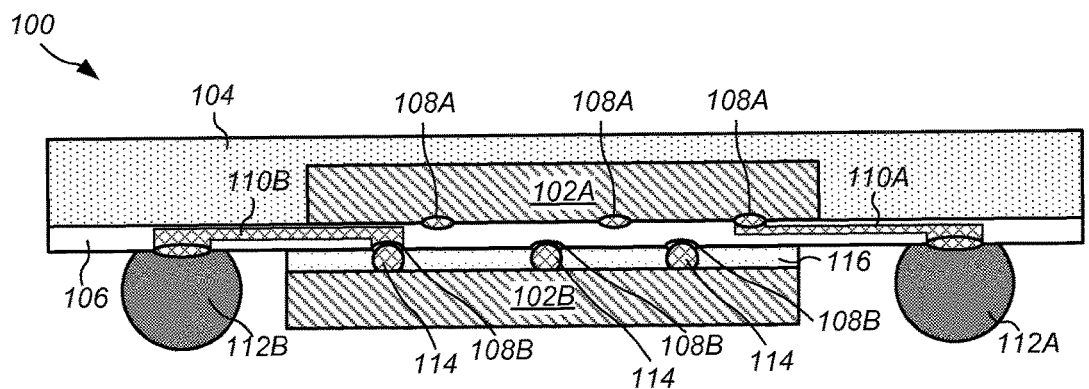
FIG. 3 depicts a cross-sectional representation of an embodiment of a top package with two offset memory die coupled with a redistribution layer.

FIGS. 1-3 depict cross-sectional representations of steps of an embodiment of a process flow for forming a top package used in a PoP ("package-on-package") package. FIG. 1 depicts a cross-sectional representation of an encapsulated memory die with a redistribution layer coupled to the memory die used in forming top package 100. Memory die 102A is at least partially encapsulated in encapsulant 104. In certain embodiments, a bottom surface of die 102A is exposed (uncovered) by encapsulant 104. Die 102A may be, for example, a semiconductor chip such as a wire-bond die or a flip chip die. In certain embodiments, die 102A is a DDR (double data rate) die (e.g., an 8 GB DDR die). Encapsulant 104 may be, for example, a polymer or a mold compound such as an overmold or exposed mold.

In certain embodiments, redistribution layer (RDL) 106 is coupled to die 102A. RDL 106 may be coupled to a bottom surface of die 102A. RDL 106 may also be coupled to encapsulant 104. RDL 106 may include materials such as, but not limited to, PI (polyimide), PBO (polybenzoxazole), BCB (benzocyclobutene), and WPRs (wafer photo resists such as novolak resins and poly(hydroxystyrene) (PHS) available commercially under the trade name WPR including WPR-1020, WPR-1050, and WPR-1201 (WPR is a registered trademark of JSR Corporation, Tokyo, Japan)). RDL 106 may be formed on die 102A and encapsulant 104 using techniques known in the art (e.g., techniques used for polymer deposition).

In certain embodiments, die 102A and RDL 106 are coupled using one or more connections 108A. Connections 108A may include landing pads or other terminals that couple die 102A to routing 110A in RDL 106. For example, connections 108A may include aluminum or copper landing pads or solder-coated or Sn-coated landing pads for coupling to routing 110A to die 102A.

After formation of RDL 106, terminals 112A, 112B may be coupled to the RDL, as shown in FIG. 1. Terminals 112A, 112B may be located on a periphery of die 102A. Terminals 112A, 112B may be used to couple top package 100 to a bottom package (e.g., a SoC package) to form a PoP package. Terminals 112A, 112B may include aluminum, copper, or another suitable conductive material. In some embodiments, terminals 112A, 112B are solder-coated or Sn-coated. In certain embodiments, terminals 112A are coupled to die 102A through routing 110A and connections 108A.

FIG. 2 depicts a cross-sectional representation of an embodiment of die 102B being coupled to die 102A and RDL 106. Die 102B may be, for example, a flip-chip semiconductor chip. In certain embodiments, die 102B is a DDR (double data rate) die (e.g., an 8 GB DDR die). In some embodiments, die 102B is identical to die 102A. Die 102B may be flipped so that terminals 114 (typically located on the bottom of the die) can be coupled to connections 108B on RDL 106. Terminals 114 may be copper or aluminum terminals. In some embodiments, terminals 114 are solder-coated or Sn-coated.

After terminals 114 are contacted to connections 108B, die 102B may be coupled to RDL 106 and die 102A with material 116, as shown in FIG. 3. Die 102B may be coupled to a bottom surface of RDL 106 (e.g., a surface of the RDL opposite the surface coupled to die 102A). Material 116 may be an electrically insulating material. In certain embodiments, material 116 is pre-applied to the surface of RDL 106 or die 102B before contacting the RDL and the die. Material 116 may be, for example, a polymer or epoxy material such as an underfill material or a non-conductive paste. For example, material 116 may be a capillary underfill material used in flip-chip bonding processes such as a snap cure underfill material or a low profile underfill material. Typically, material 116 is an electrically insulating material that cures at or lower than the melting temperatures of the materials used in terminals 114 and connections 108B (e.g., the solder melting temperature).

In some embodiments, if terminals 114 are copper, material 116 is a non-conductive paste and terminals 114 are coupled (bonded) to connections 108B using a thermal compressing bonding process (e.g., a flip-chip thermal compression bonding process). An example of a flip-chip thermal compression bonding apparatus that may be used is an FC3000 Flip Chip Bonder available from Toray Engineering Co., Ltd. (Tokyo, Japan). In some embodiments, material 116 is a capillary underfill material and terminals 114 are coupled (bonded) to connections 108B using a mass reflow process (e.g., using a solder reflow oven).

In some embodiments, terminals 112A, 112B are coupled to RDL 106 after coupling terminals 114 and connections 108B. The same process used to couple terminals 114 and connections 108B may be used to couple terminals 112A, 112B to RDL 106. For example, terminals 112A, 112B may be coupled using the same mass reflow process used to couple terminals 114 and connections 108B.

Coupling terminals 114 on die 102B to connections 108B in RDL 106 couples die 102B to routing 110B in the RDL. Routing 110B may provide connection to terminals 112B for die 102B while routing 110A provides connections between terminals 112A and die 102A. Routing 110A and routing 110B may be, for example, metal lines in RDL 106. In certain embodiments, routing 110B is electrically isolated from routing 110A in RDL 106. Electrically isolating routing 110A and routing 110B allows die 102A and die 102B to be individually connected to a bottom package through terminals 112A and terminals 112B, respectively.

Routing 110A and routing 110B, shown in FIGS. 1-3, are only shown for one terminal 112A coupled to die 102A and one terminal 112B coupled to die 102B for simplicity in the drawings. It is to be understood that additional routing exists for each of the terminals coupled to each memory die and that the routing may be in any configuration contemplated by one skilled in the art.

As shown in FIG. 3, die 102B is offset from die 102A. Offsetting die 102A and die 102B offsets connections 108A from connections 108B (e.g., creating a staggered bump pattern between the die). Offsetting connections 108A and connections 108B allows a single layer of routing (e.g., a single layer of metal lines that define routing 110A and routing 110B) in RDL 106 (e.g., RDL 106 is a single layer RDL). Single layer RDL 106 is possible because connections 108A and 108B do not overlap, which allows routing 110A and routing 110B to be in the same layer without any electrical connection between the individual routings for die 102A and die 102B.

Figure 4:
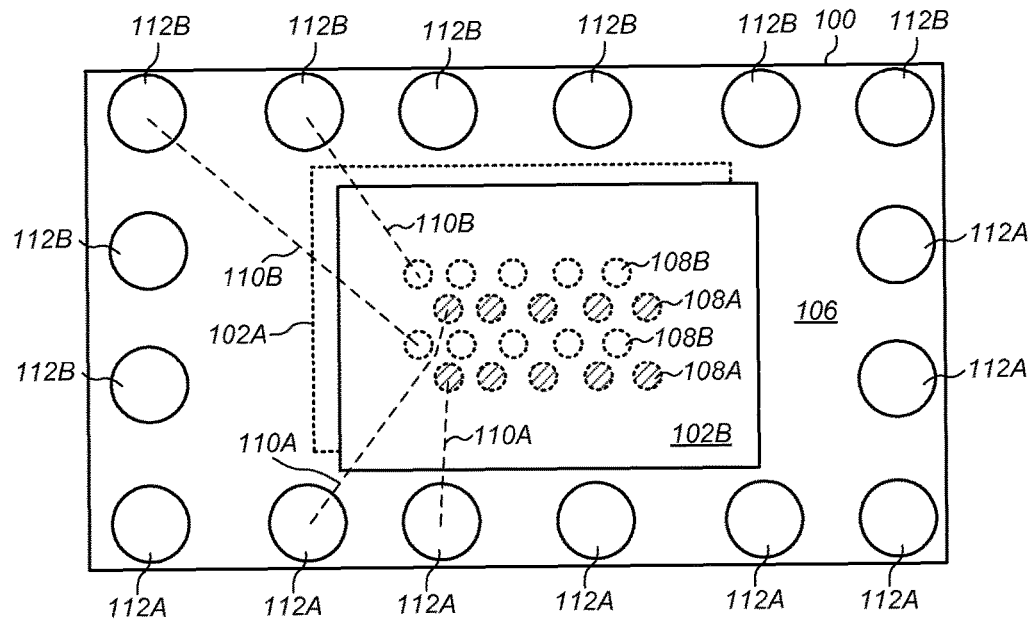
FIG. 4 depicts a bottom view representation of the embodiment depicted in FIG. 3.

FIG. 4 depicts a bottom view representation of the embodiment of top package 100 depicted in FIG. 3. Routing 110A couples connections 108A to terminals 112A and routing 110B couples connections 108B to terminals 112B. As shown in FIG. 4, the offset between die 102A and die 102B offsets connections 108A from connections 108B. Because connections 108A and connections 108B are offset (not overlapped), routing 110A and routing 110B may both be in the same layer in RDL 106 without the separate routings electrically connecting (shorting).

Figure 5:
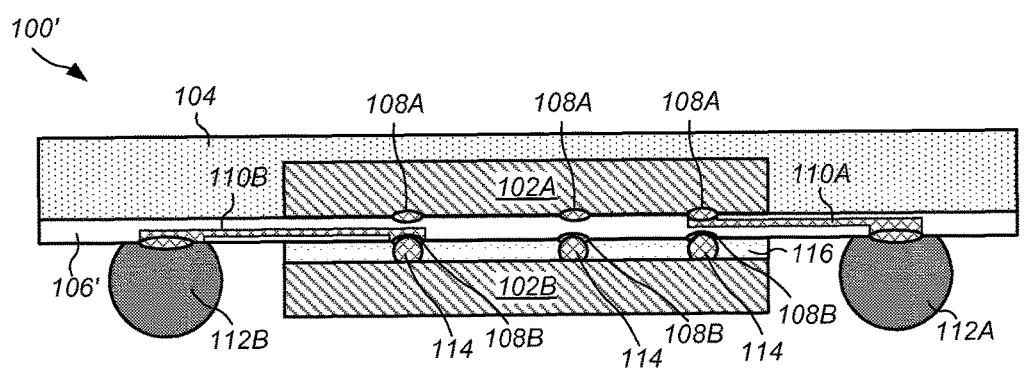
FIG. 5 depicts a cross-sectional representation of another embodiment of a top package with two memory die coupled with a redistribution layer.

In some embodiments, die 102A and die 102B are not offset and connections 108A and connections 108B are aligned (e.g., the connections overlap). FIG. 5 depicts a cross-sectional representation of an embodiment of top package 100' with die 102A and die 102B coupled with no offset between the die. Because connections 108A and 108B overlap in top package 100', RDL 106' may include two or more layers of routing (e.g., RDL 106' is a 2 L (two layer) RDL). The multiple layers of routing (e.g., routing 110A is in one layer and routing 110B is in another layer) may be used to inhibit electrical contact between the individual routings (e.g., electrically isolate routing 110A from routing 110B) and allow die 102A and die 102B to be individually connected to a bottom package through terminals 112A and terminals 112B, respectively.

As shown in FIGS. 3 and 5, the presence of RDL 106 (or RDL 106') in top package 100 allows for bonding and electrical coupling of die 102A, 102B to a bottom package through terminals 112A, 112B. Terminals 112A, 112B may be located on the periphery of die 102A, 102B. Using RDL 106 to couple die 102A, 102B to terminals 112A, 112B on the periphery of the die reduces an overall thickness of top package 100 by eliminating the use of wire bonding or other connection techniques that add height to the top package.

In addition, RDL 106 may be a relatively thin layer compared to substrates typically used for memory packages (e.g., top packages in PoP packages). For example, a single layer RDL may have a thickness of less than about 10 μm (e.g., about 5 μm) while typical organic substrates have thicknesses of about 200 μm or more. Thus, using RDL 106 in top package 100 reduces the overall thickness of the top package and a PoP package containing the top package, especially for the single layer RDL. For example, top package 100 may have a thickness between about 200 μm and 300 μm with a substantial majority of the thickness of the top package being due to the combined thickness of die 102A and die 102B. Reducing the thickness of top package 100 may allow increases in circuit density or package density and improve performance of a device using the top package.

Using routing 110A, 110B in RDL 106 may also decrease the impedance between die 102A, 102B and terminals 112A, 112B compared to connections made using wire-bonding techniques. The impedance may be decreased through the use of high conductivity metal lines in RDL 106 and/or reduced path lengths between the connections on the die and the terminals (e.g., shorter interconnects between the die and the terminals). Wire-bonding typically includes looped or rounded paths to allow for connections to upper surfaces of the dies and the substrate. Thus, the path length may be shorter using routing in the RDL because more direct connections between the die and the terminals are provided (e.g., no rounded or looped paths are needed). Additionally, couplings between die 102A, 102B, connections 108A, 108B, routing 110A, 110B, and/or terminals 112A, 112B may be more robust than wire-bonding connections.

Reducing the impedance between die 102A, 102B and terminals 112A, 112B may provide better signal and power integrity in top package 100 (or top package 100') compared to top packages made using wire-bonding between the die and the terminals. Providing better signal and power integrity may improve device performance. In addition, utilization of RDL 106 in top package 100 may reduce yield losses (compared to top packages using wire-bonding) and potentially reduce manufacturing costs with the improved yield.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor device package, comprising:
a first memory die at least partially encapsulated in an encapsulant with at least one surface of the first memory die exposed through the encapsulant;
a redistribution layer coupled to the exposed surface of the first memory die, the redistribution layer having a single layer of metal;
a second memory die coupled to the redistribution layer, wherein the second memory die is coupled on an opposing surface of the redistribution layer from the first memory die, and wherein the second memory die is offset from the first memory die;
a plurality of terminals coupled to the opposing surface of the redistribution layer, wherein the couplings between the redistribution layer and the terminals lie in substantially the same plane as the coupling between redistribution layer and the second memory die; and
routing in the redistribution layer, the routing consisting of a first routing and a second routing in the single layer of metal, the first routing consisting of routing between a first set of the terminals and the first memory die and the second routing consisting of routing between a second set of the terminals and the second memory die, wherein the first routing and the second routing are electrically isolated from each other;
wherein the first memory die and the second memory die are individually connectable to an additional semiconductor device package through the first set of terminals and the second set of terminals, respectively, and wherein the first memory die and the second memory die independently communicate with the additional package during use due to the electrical isolation of the first routing and the second routing.

2. The package of claim 1, wherein the terminals are coupled to the redistribution layer on a periphery of the first memory die and a periphery of the second memory die.

3. The package of claim 1, wherein the second memory die is flip-chip coupled to the redistribution layer.

4. The package of claim 1, wherein the second memory die is coupled to the redistribution layer with a non-conductive paste.

5. The package of claim 1, wherein the second memory die is coupled to the redistribution layer with a capillary underfill material.

6. The package of claim 1, further comprising a first set of connections between the first memory die and the redistribution layer and a second set of connections between the second memory die and the redistribution layer, wherein the first set of connections are offset from the second set of connections.

7. The package of claim 1, wherein the first die and the second die are substantially identical in function.

8. A semiconductor device package, comprising:
a mold material with a first memory die at least partially enclosed in the mold material;
a redistribution layer coupled to a bottom surface of the mold material, the redistribution layer having a single layer of metal;
a second memory die coupled to a bottom surface of the redistribution layer, wherein the bottom surface of the redistribution layer is substantially planar, and wherein the second memory die is offset from the first memory die;

a plurality of terminals coupled to the substantially planar bottom surface of the redistribution layer on a periphery of the first memory die and a periphery of the second memory die; and routing in the redistribution layer, the routing consisting of a first routing and a second routing in the single layer of metal, wherein the first routing consists of routing that couples the first memory die to a first set of the terminals and the second routing consists of routing that couples the second memory die to a second set of the terminals, the first routing and the second routing being electrically isolated from each other, wherein the first memory die and the second memory die are individually connectable to an additional semiconductor device package through the first set of terminals and the second set of terminals, respectively, and wherein the first memory die and the second memory die independently communicate separately with the additional package during use due to the electrical isolation of the first routing and the second routing.

9. The package of claim 8, further comprising a non-conductive paste between the second memory die and the redistribution layer.

10. The package of claim 8, further comprising a capillary underfill material between the second memory die and the redistribution layer.

11. The package of claim 8, wherein the first set of terminals are electrically isolated from the second set of terminals.

12. The package of claim 8, wherein the first die and the second die are substantially identical in function.

13. The package of claim 8, wherein the first die and the second die have staggered bump patterns.

14. A method for forming a semiconductor device package, comprising:

at least partially encapsulating a first memory die in an encapsulant with at least one surface of the first memory die exposed through the encapsulant;

coupling a first surface of a redistribution layer to the first memory die, the redistribution layer having a single layer of metal, wherein the redistribution layer comprises routing in the single layer of metal, the routing consisting of a first routing and a second routing in the single layer of metal, the first routing and the second routing being electrically isolated from each other;

coupling a plurality of terminals to a second surface of the redistribution layer, wherein the first routing consists of routing coupling a first set of the terminals to the first memory die; and coupling a second memory die to the second surface of the redistribution layer, wherein the coupling between the second memory die and the second surface of the redistribution layer and the couplings between the terminals and the second surface of the redistribution layer lie in substantially the same horizontal plane, wherein the second memory die is offset from the first memory die, and wherein the second routing consists of routing coupling a second set of the terminals to the second memory die, wherein the first memory die and the second memory die are individually connectable to an additional semiconductor device package through the first set of terminals and the second set of terminals, respectively, and wherein the first memory die and the second memory die independently communicate with the additional package during use due to the electrical isolation of the first routing and the second routing.

15. The method of claim 14, further comprising coupling the second memory die to the redistribution layer using reflow of a capillary underfill material.

16. The method of claim 14, further comprising coupling the second memory die to the redistribution layer using thermal compression bonding with a non-conductive paste.

17. The method of claim 14, further comprising coupling the redistribution layer to the encapsulant.

18. The method of claim 14, wherein the redistribution layer is positioned between the first memory die and the second memory die.

19. The method of claim 14, wherein the first die and the second die are substantially identical in function.

20. The method of claim 14, further comprising coupling the first routing in the redistribution layer to a first set of connections on the first memory die, and coupling the second routing in the redistribution layer to a second set of connections on the second memory die, wherein the first set of connections are offset from the second set of connections.

* * * * *